US011269056B2

(12) United States Patent
Billaud

(10) Patent No.: US 11,269,056 B2
(45) Date of Patent: Mar. 8, 2022

(54) METHOD FOR MEASURING AZIMUTH ACCURACY AND PATTERNS OF THE MAIN ANTENNA LOBE OF A SECONDARY RADAR, AND RADAR IMPLEMENTING SUCH A METHOD

(71) Applicant: THALES, Courbevoie (FR)

(72) Inventor: Philippe Billaud, Limours (FR)

(73) Assignee: THALES, Courbevoie (FR)

( * ) Notice: Subject to any disclaimer, the term of this patent is extended or adjusted under 35 U.S.C. 154(b) by 113 days.

(21) Appl. No.: 16/696,988

(22) Filed: Nov. 26, 2019

(65) Prior Publication Data
US 2020/0191910 A1    Jun. 18, 2020

(30) Foreign Application Priority Data
Dec. 18, 2018    (FR) ...................................... 1873035

(51) Int. Cl.
*G01S 7/40*   (2006.01)
*G01S 13/79*   (2006.01)
*G01S 13/91*   (2006.01)
*G01S 13/00*   (2006.01)

(52) U.S. Cl.
CPC ............ *G01S 7/4026* (2013.01); *G01S 13/79* (2013.01); *G01S 13/91* (2013.01); *G01S 7/403* (2021.05); *G01S 7/4034* (2021.05)

(58) Field of Classification Search
CPC ........ G01S 7/4026; G01S 13/79; G01S 13/91; G01S 7/403; G01S 7/4034; G01S 7/4091; G01S 13/4418; G01S 13/782; G01S 13/762; G01S 13/76; G01S 5/0221; G01S 7/40; G01R 29/10
See application file for complete search history.

(56) References Cited

U.S. PATENT DOCUMENTS 4,994,810 A * 2/1991 Sinsky .................... G01S 7/40
                                                  342/151
5,977,906 A * 11/1999 Ameen ................ G01S 7/4026
                                                  342/174

(Continued)

FOREIGN PATENT DOCUMENTS

EP    2 960 671 A1    12/2015

*Primary Examiner* — Bernarr E Gregory
(74) *Attorney, Agent, or Firm* — BakerHostetler

(57) ABSTRACT

Each pattern being associated with a reception channel, over a given time period, the unsolicited asynchronous replies, of long ADS-B squitters type, transmitted by targets present in the airborne environment of the radar, are detected, each of the squitters containing position information on the target which transmits it; for each detection, the long ADS-B squitter is decoded to check that the detected target is located in accordance with the position information contained in the squitter, the non-conforming detections being rejected; for each detection retained, the time of the detection, the value of the azimuth of the main beam of the antenna and the received power value on each of the reception channels is associated with the detection, the position information contained in the squitters giving the elevation segment wherein the detection is situated; the values obtained over the period being stored, the measured patterns being sampled, by elevation segment, from the stored values.

13 Claims, 9 Drawing Sheets

(56) References Cited

U.S. PATENT DOCUMENTS 7,429,950 B2 * 9/2008 Smith .................. G01S 5/0221
              342/174
2008/0042896 A1    2/2008 Alon et al.
2012/0001793 A1    1/2012 Jacobs et al.

* cited by examiner

METHOD FOR MEASURING AZIMUTH ACCURACY AND PATTERNS OF THE MAIN ANTENNA LOBE OF A SECONDARY RADAR, AND RADAR IMPLEMENTING SUCH A METHOD

CROSS-REFERENCE TO RELATED APPLICATIONS

This application claims priority to foreign French patent application No. FR 1873035, filed on Dec. 18, 2018, the disclosure of which is incorporated by reference in its entirety.

FIELD OF THE INVENTION

The present invention relates to a method for measuring antenna patterns and the azimuth accuracy of the angle error measurement function of secondary radars. It relates also to a secondary radar implementing such a method.

The preferred field of the invention is Air Traffic Control (ATC) for which the performance of the radar is fundamental both for the detection of the aircraft and for the very accurate locating of the targets in azimuth up to several hundreds of kilometres.

BACKGROUND

These accuracy performance levels are particularly linked to the quality of the patterns of the antenna with which the secondary radars employed in ATC or in IFF are equipped.

Hereinafter in the description, for the purposes of simplification, antenna will be used to refer by extension to the assembly composed:
  primarily of the antenna of the radar of any type, Large Vertical Aperture LVA or beam;
  of the rotating joint joining the rotary part and the fixed part of the radar; of download cables.

Currently, the measurement of the azimuth accuracy of a secondary radar requires an external beacon whose radar exploits the replies to locate it and consequently controls the correct operation of the angle error measurement function of the radar.

A more independent radar measurement of the quality of the patterns of the main lobe of an antenna (substantially lying between −10° and +10° in ATC) installed on a radar site requires both;
  switching the station to maintenance mode, which reduces the radar coverage to the system level;
  the use of external tools to measure, in reception (at 1090 MHz), the patterns of the antenna, SUM, CONT and DIFF;
this usually being performed only for an elevation value which is that of the tools, generally very close to the radar, therefore with a very low elevation value, often close to zero (same height as the radar) whereas the aeroplanes are situated primarily between 0.5° and 20° depending on the type of radar use ("Airport" or "En Route" configuration).

In the absence of periodic preventive measurements of the antenna patterns and of the azimuth accuracy of the radar, or even between two preventive measurement sessions, the degradation of these patterns is then perceived by the user only when the performance levels of the radar are degraded, sometimes to the point of no longer fulfilling its mission. In this case, the interruption of service is then imposed and the repairing of the antenna must be performed with urgency, bearing in mind it involves the most important and complicated radar maintenance task.

It is recalled that angle error measurement is a method for measuring the misalignment of a target, present in the main beam, relative to the axis of the antenna, and that, since the secondary radar has to ensure, in its primary mission, the locating of all the detected targets very accurately both in terms of distance and azimuth relative to the radar, its angle error measurement function is fundamental to it because it contributes directly to its azimuth accuracy.

SUMMARY OF THE INVENTION

One aim of the invention is notably to make it possible to measure the azimuth accuracy of the antenna patterns of a secondary radar, and thereby assess the degradation thereof.

To this end, the subject of the invention is a method for measuring antenna patterns and angle error measurement by elevation segments of a secondary radar, each pattern being associated with a reception channel, characterized in that over a given time period:
  the unsolicited asynchronous replies, of long ADS-B squitters type, transmitted by targets present in the airborne environment of said radar, are detected, each of said squitters containing 3D position information on the target which transmits it;
  for each detection, the long ADS-B squitter is decoded to check that the detected target is located in accordance with the position information contained in said squitter, the non-conforming detections being rejected;
  for each detection retained, the time of said detection, the value of the azimuth of the axis of the main beam of said antenna, the angle error measurement voltage and the received power value on each of said SUM, DIFF, CONT_Front, CONT_Back reception channels are associated with said detection, the position information contained in said squitter giving, by calculation, the elevation segment in which said detection is situated;
said values obtained over said period being stored, the measured patterns and the angle error measurements being sampled, by elevation segment, from said stored values, Said antenna comprises, for example, one of the following sets of patterns:
  a sum pattern (SUM), a difference pattern (DIFF), a control pattern for rejecting replies from targets facing the antenna (CONT_Front) and a control pattern for rejecting targets behind the antenna (CONT_Back);
  a sum pattern (SUM), a difference pattern (DIFF), a control pattern (CONT);
  a sum pattern (SUM) and a difference and control pattern (DIFF/CONT).

In a particular implementation, the replies of long ADS-B squitters type are enriched by characteristics representative of the acquisition of said replies, said characteristics being, for each reply, at least one of the following characteristics:
  the received power according to each pattern of said antenna;
  the angle error measurement of the reply in the main lobe of said antenna;
  the time of the detection of said reply;
  the azimuth of the axis of the main beam of said antenna upon said detection.

For example, for each squitter received in the main beam, said method:
exploits the information contained in the squitter;
calculates the relative power then the error of the gain of the patterns of the antenna as a function of the relative bearing:
in the same beam, said radar measuring the power of the synchronous plot, said power being the maximum value of the sum pattern;
the long ADS-B squitter reply being enriched with a measurement of power on the sum, difference and control patterns, the method according to the invention deducing, for the relative bearing of the squitter:
SUM-relative (dB)=SUM (in dBm)−SUM_max (in dBm);
DIFF-relative (dB)=DIFF (in dBm)−SUM_max (in dBm);
CONT-relative (dB)=CONT (in dBm)−SUM_max (in dBm);
the gain error of each pattern is established by comparing these values to those of reference of the invention (patterns measured either on receipt of the radar in the factory, or on acceptance of the radar site):
SUM_err (dB)=SUM-relative (dB)−SUM-reference (dB);
DIFF_err (dB)=DIFF-relative (dB)−DIFF-reference (dB);
CONT_err (dB)=CONT-relative (dB)−CONT-reference (dB);
calculates the angle error measurement error by taking account of the deformation of the beam in elevation relative to the antenna.

For the duration of the analysis, said values are, for example, accumulated as a function of the relative bearing over time according to:
the azimuth of said antenna;
the elevation of said target.

Over said given period, the angle error measurement error and the error of each pattern are accumulated for example in tables with three inputs, one table being associated with the angle error measurement error and with the error of each antenna pattern, one input being the relative bearing as a function of the axis of the main lobe of the antenna, the second input being the elevation of the target as a function of the horizontal alignment of the antenna and the third input being the antenna azimuth. Each cell (relative bearing, elevation) of the angle error measurement error and of the error of each pattern is, for example, established by methods of average, histogram or other type.

Said given period is for example defined to reveal current degradations of said patterns.

Under the control of an operator or automatically, said radar employing an angle error measurement table to locate the synchronous targets in azimuth in said main beam, said table is for example corrected on the basis of the measured angle error measurement errors in order to ensure a good azimuth accuracy of said radar in the event of a degradation of the set of components called aerial.

The antenna, with which a secondary radar of ATC or IFF type is equipped, comprises, for example, at least two patterns. Said antenna has fixed or rotating electronic scanning.

The measurements of the angle error measurement error and of the antenna patterns are for example used to evaluate the level of degradation for each element of the aerial: antenna, download cables, rotating joint.

The measurement of said patterns is for example used to evaluate the level of degradation of the set of components called aerial.

Another subject of the invention is a secondary radar implementing such a method.

BRIEF DESCRIPTION OF THE DRAWINGS

Other features and advantages of the invention will become apparent from the following description, given in light of the attached drawings which represent.

DETAILED DESCRIPTION

Figure 1:
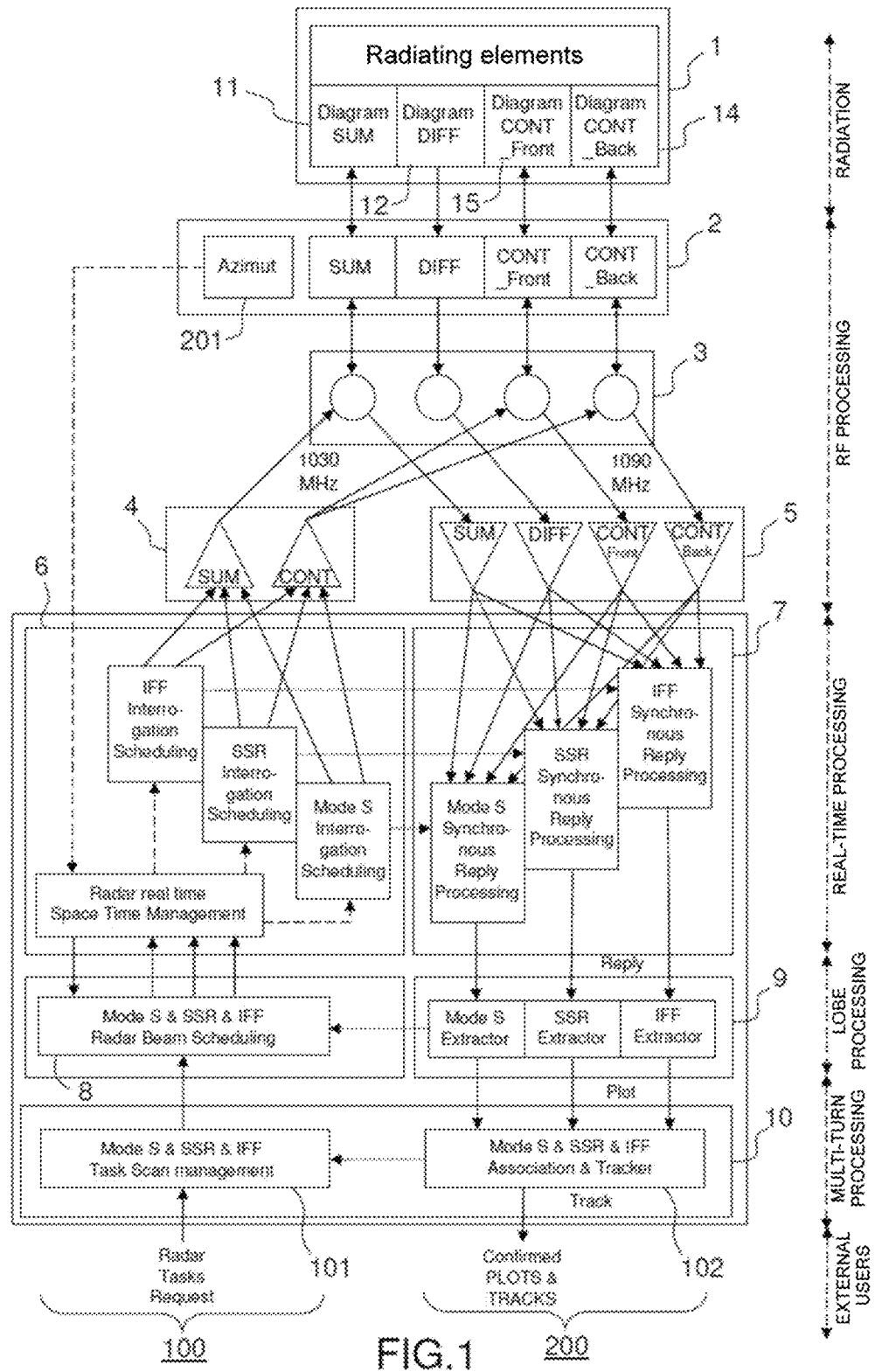
FIG. 1, an example of block diagram of a Mode S secondary radar.

With respect to FIG. 1, which represents an example of block diagram of a Mode S radar, the principles of such a radar are reviewed.

The principle of the Mode S secondary radar (defined in detail by the ICAO Annexe 10 vol. 4) consists in:
transmitting selective interrogations:
either indicating the recipient: a single target designated by its Mode S address;
or indicating the identifier of the transmitter;
receiving selective replies:
either indicating the identifier of the transmitter: the same Mode S address of the target;
or indicating the recipient: identifier of the interrogator.

In its normal use, the secondary radar operates in synchronous mode, that is to say that it transmits an interrogation and awaits a reply consistent therewith, which allows it to locate, by measurement (in azimuth and distance), and identify (by the Mode S address) the target.

To perform this task efficiently, the radar is equipped with an antenna 1 (FIG. 1) having several patterns 11, 12, 14, 15 whose roles are conventionally:
a sum pattern 11, hereinafter denoted SUM, for interrogating and detecting the synchronous reply from the target;
a difference pattern 12, denoted DIFF, for finely locating the target in the SUM beam;

a first control pattern 15, denoted CONT_Front, for blocking and rejecting the replies from targets facing the antenna not present in the main SUM beam;

a second control pattern 14, denoted CONT_back, for blocking and rejecting the replies from targets at the back of the antenna (therefore necessarily not present in the main SUM beam).

Depending on the missions and therefore the performance levels expected of the radar, the antennas can be:

of several patterns:
- 4 patterns: SUM, DIFF, CONT_Front & CONT_Back;
- 3 patterns: SUM, DIFF, CONT (CONT_Front and CONT_Back are grouped together at the antenna level);
- 2 patterns: SUM, DIFF/CONT (DIFF, CONT_Front and CONT_Back are grouped together at the antenna level).

of different dimensions:
in width:
- having a great width to have a fine main beam providing a high gain and to be selective and accurate in azimuth;

in height:
- having a great height, of Large Vertical Aperture (LVA) type, adding gain and protection against ground reflections (primarily in ATC);
- having a small height, of "beam" type, adding mobility (primarily used in IFF).

While the SUM and DIFF patterns are conventionally fine with 3dB lobes between 2.4° and 10°, the CONT_Front and CONT_Back patterns each seek to cover practically 180°.

The antennas can also be:
of fixed pattern, called "mechanical" and rotating;
of changing pattern with electronic scanning called fixed or rotating "AESA".

Hereinafter in the description, the most comprehensive antenna configuration is described, in other words 4 patterns in rotating antenna mode, bearing in mind that the other configurations are dealt with similarly whatever the number of antenna patterns used, whether the antenna is rotating or fixed. To simplify the description, it will however be possible to use the 3-pattern configuration by using CONT as a combination of CONT_Front and CONT_Back.

In its operational use, the radar receives unsolicited replies (without associated interrogation on its part), the latter being called "False Reply Unsynchronized in Time", or Fruit. They are thus named because:

they are not expected by the radar which rejects them ("False");

they are replies very similar to those that are synchronous and obtained from the same targets in the same radar coverage, having the same frequency and the same message format ("Reply");

they are not associated with an interrogation from this radar, but from another radar or even transmitted by the target periodically such as ADS-B squitters ("Unsynchronized in Time").

By virtue of their asynchronous characteristic, the Fruits are received by the radar on all its antenna patterns.

Finally, the Mode S Fruits can all be identified by the single Mode S address associated with each target.

While the Fruits generated by a secondary radar are currently processed as faults which have to be filtered before processing, the invention advantageously exploits the Fruits that are the long ADS-B squitters during the processing to measure the angle error measurement accuracy of the radar and the antenna patterns.

In conclusion, the measurement of the patterns of the main lobe of an antenna is performed continuously with no influence on the operational operation of the radar and is applicable regardless of the type of the antennas described.

Among the Mode S Fruits that a radar receives, the ADS-B squitters are not solicited by another interrogator (radar, WAM, etc) but generated without solicitation by the aeroplane itself to signal its presence and, in the case of the long ADS-B squitters (DF17), to also give their position, calculated with accuracy by exploiting the GPS signals.

The fundamental principle of the receiver of long ADS-B squitters using the same Mode S protocol (messages defined in detail by the ICAO Annexe 10 vol. 4) consists in:

receiving unsolicited, therefore asynchronous, selective replies;

indicating the identifier of the transmitter: the same Mode S address (24-bit field) of the target as that transmitted to the radar in the selective interrogations and replies described hereinabove;

the nature of the content of the message (DF=17) is variable according to the TC field of the message:
1 to 4 "Aircraft identification"
5 to 8 "Surface position"
9 to 18 "Airborne position (Baro Alt)"
19 "Airborne velocities"
20 to 22 "Airborne position (GNSS Height)"
23 "Test message"
24 "Surface system status"
25 to 27 "Reserved"
28 "Extended squitter AC status"
29 "Target state and status (V.2)"
30 "Reserved"
31 "Aircraft Operation status".

The above list is given by way of example, it is indicative and subject to change.

The invention exploits in particular the DF17 squitters of the corresponding TC field from 9 to 18 or from 20 to 22 giving the position in 3 dimensions of the target equipped with the transponder broadcasting the squitter associated with an altitude, either barometric or GNSS.

In its normal use, an ADS-B_in receiver therefore operates in asynchronous mode, that is to say that it listens over 360° for a Mode S message very similar to that of the radar for the location (azimuth and distance) and the identification (Mode S address) of a target.

To perform this task efficiently, the ADS-B_in receiver is equipped: either with an omnidirectional antenna covering 360°, which is a routine configuration;

or with several wide pattern antennas covering 360° in all:
two antennas of coverage greater than 180° back-to-back, which is the most widely-used configuration;
more rarely, three antennas of coverage greater than 120° or even four antennas of coverage greater than 90;

the role of which is solely, through a single pattern (of sum type), to detect the asynchronous reply from the target and decode the content thereof, according to the formats reviewed hereinabove.

Given that the secondary radar and the ADS-B receiver exploit messages that are almost identical (same 1090 MHz frequency, same wave form, same data structure of the reply message), it is easy to incorporate in the radar the function of listening for the asynchronous ADS-B squitters by listening for the latter through the different patterns of the antenna of the radar, and to do so primarily, but not solely, through the omnidirectional pattern:
by several receivers each associated with a pattern of its antenna:
for an antenna with 4 patterns: SUM, DIFF, CONT_Front and CONT_Back;
for an antenna with 3 patterns: SUM, DIFF, CONT;
for an antenna with 2 patterns: SUM, DIFF/CONT.

In the context of the invention, the radar is equipped according to this configuration, namely one receiver associated with each pattern of its antenna, whether it comprises four, three or two patterns.

Before describing the invention in more detail, the constituent elements of the Mode S radar of FIG. 1 are described. The block diagram reveals the synchronous operation of the Mode S radar:
on the left hand part 100 by the generation of the interrogations;
on the right hand part 200 by the synchronous processing of the associated replies,
as well as the synchronizations between the latter by the arrows crossing between left and right.

The functions of the main elements are reviewed hereinbelow:

The antenna 1 ensures the radiation of the interrogations at 1030 MHz and of the replies in return at 1090 MHz, according to the four patterns: SUM, DIFF, CONT_Front and CONT_Back, or three patterns (SUM, DIFF, CONT) or according to two patterns (SUM, DIFF/CONT).

A rotating joint 2 and downlead cables, for a rotary antenna, ensure:
the RF coupling of the signals transmitted at 1030 MHz and received at 1090 MHz independently for the four patterns between the rotating part and the fixed part of the radar;
the broadcasting of the position in azimuth 201 of the axis of the main lobe of the antenna.

An RF processing comprises:
a duplexer or circulator 3 ensuring the RF coupling between the signals transmitted at 1030 MHz and received at 1090 MHz independently for the four patterns;
a transmitter 4 ensuring:
the transmission of the interrogations at 1030 MHz on the SUM pattern; the blocking of the transponders outside of the SUM lobe at 1030 MHz by the CONT_Front and CONT_Back patterns;
the same for the different secondary protocols: IFF, SSR and Mode S;
a receiver 5 ensuring the reception of the replies at 1090 MHz on the four SUM, DIFF, CONT_Front and CONT_Back patterns and the calculation of the angle error measurement for the different secondary protocols: IFF, SSR and Mode S.

A real-time processing comprises:
space-time management 6 ensuring the real-time management of the associated interrogation and listening periods for the different secondary protocols: IFF, SSR and Mode S;
a signal processing 7 ensuring:
the processing of the replies in the listening periods associated with the interrogations for the different secondary protocols: IFF, SSR and Mode S;
the detection and the decoding of the synchronous replies in the main lobe of the antenna by exploiting the four patterns:
SUM: to detect the replies received in the main lobe;
DIFF: to finely locate in azimuth the replies received in the main SUM lobe and possibly for the discrimination of entangled replies;
CONT_Front and CONT_Back: to reject the replies received on the secondary SUM and DIFF lobes in the case of a detection in the main SUM lobe.

A processing in the main lobe of the antenna comprises:
a management 8 of the targets present in the lobe, ensuring:
the preparation of the transactions (interrogations and replies) to be performed in the next lobe for the different secondary protocols, IFF, SSR and Mode S;
the placement of the Mode S interrogations and replies in the future "Roll call" period as a function of the state of the transactions that have just been performed;
extractors 9 ensuring the formation of plots for each of the different secondary protocols, IFF, SSR and Mode S, from the synchronous replies received in the lobe according to the protocol employed in the interrogations.

A multi-turn processing 10 comprises:
a management 101 of the Mode S tasks to be performed with the targets in the coverage, ensuring the prediction of positions of the targets (antenna rendez-vous) and the preparation of the tasks to be performed with these positions according to the internal and external requests and the state of the transactions of the preceding turns;
an association of the plots and a tracking 102 of the targets in the coverage ensuring the tracking of the targets to enhance the performance levels (elimination of false plots, checking of decoded data in particular) and to predict the future position thereof.

An interface with the users makes it possible for the radar to take account of different requests and display plots and target tracks.

The selective interrogation principle of the Mode S based on the interrogation on the next turn by using the position prediction performed from the earlier measurements is therefore conceptually highly sensitive to the accuracy of these measurements. A measured position error induces a predicted position error of the Mode S radar on the next turn that can lead, when that occurs:
to selective interrogations that are pointless because they are badly positioned in azimuth relative to the real position of the target;
or, in the worst case, to the non-detection of the target in that turn.

It is therefore very important to "monitor" the accuracy of the azimuth measurement of the radar based on the use of angle error measurement.

Figure 2:
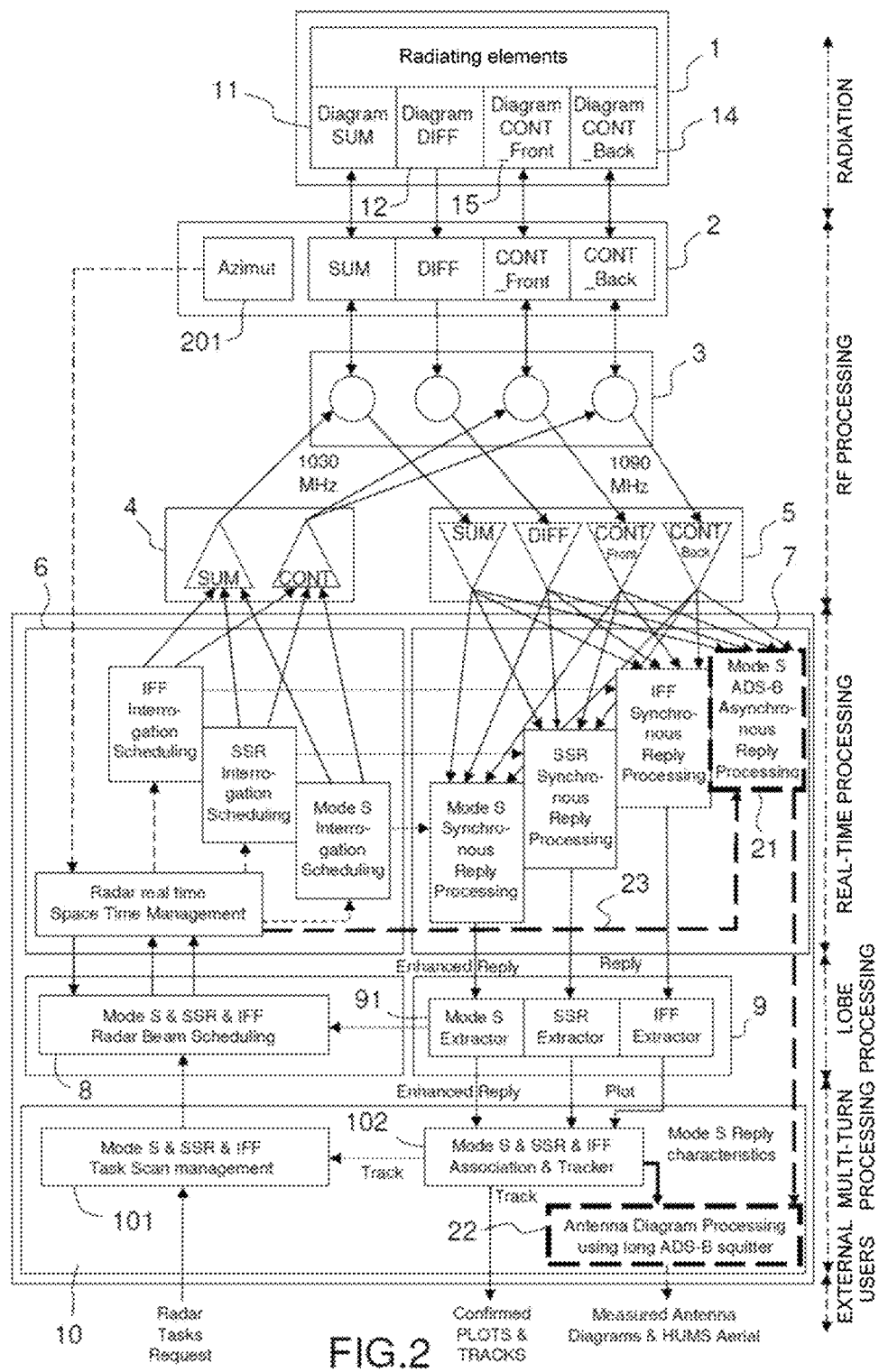
FIG. 2, an illustration of the hardware implementation of the invention.

FIG. 2 illustrates the hardware implementation of the invention applied to a Mode S radar having an antenna with four patterns. The figure shows the block diagram of the radar of FIG. 1 with elements added that are specific to the invention. The main elements of the invention applied to the Mode S radar are represented by bold broken lines in FIG. 2.

Although the operation of a Mode S radar is synchronous, it can be seen that the added processes 21, 22 are not linked to the transmission and exploit only the azimuth position of the axis of the main lobe of the antenna 23.

Most of the elements remain unchanged, thereby bearing out both:
- the non-intrusion of the invention in the operational operation of the Mode S radar;
- the measurement using the same elements that the radar exploits via the same receiver:
  - antenna;
  - rotating joint;
  - download cables.

A first processing is added 21 to process the reception of the ADS-B squitters. It ensures an ongoing processing of the asynchronous replies in Mode S (independently of the listening periods associated with the interrogations), this processing 21 ensures the detection and the decoding of the asynchronous replies by separately but equally exploiting the four antenna patterns: SUM, DIFF, CONT_Front and CONT_Back, to:
- detect all the replies received, asynchronous and synchronous;
- decode the replies to extract the Mode S address therefrom;
- to enrich each decoded reply with its characteristics, in particular:
- the detection time;
- the azimuth of the main lobe of the antenna upon the detection;
- the received power in the SUM, DIFF, CONT_Front and CONT_Back patterns;
- the angle error measurement of the ADS-B reply, that is to say the measurement of the misalignment of the reply with respect to the axis of the antenna.

To this end, the space-time management 6 transmits the azimuth position 23 of the main lobe of the antenna to the ongoing processing 21 of the Mode S asynchronous replies.

In parallel and advantageously, an enrichment of the synchronous replies is obtained through the powers measured on the SUM, DIFF, CONT_Front and CONT_Back patterns, complemented by the angle error measurement.

At the extractors 9 there is also obtained an enrichment of the Mode S plots of the power measured on SUM.

A second added element 22 stores and correlates the data contained in the long ADS-B squitter replies (DF17) and the measurements of the characteristics of these squitter replies by the radar. In particular, it performs the calculation of the 3 SUM, DIFF, CONT_Front and CONT_Back antenna patterns in elevation as well as the angle error measurement error in elevation by exploiting the position given in the long ADS-B squitters. This second processing is added in the multi-turn processing where the position of the target transmitted in the squitter with the Mode S address, time and position complemented by the values measured with this same squitter reply of the power measured on SUM, DIFF, CONT_Front and CONT_Back, angle error measurement and antenna azimuth.

This second added element 22 implements the principle of the invention which consists in exploiting the fact that the long ADS-B squitters:
- are intrinsically asynchronous between the period of the ADS-B squitters and the rotation of the radar;
- being received at any moment, they therefore sample the patterns of the main beam of the antenna at different relative bearings;
- being transmitted by different targets, they sample the patterns of the main beam of the antenna at different elevations, those of the targets having generated them;
- transmit an accurate position measurement other than that of the radar (GPS position of the long ADS-B squitter);

make it possible to perform the radar-type measurement on the same squitter.

Figure 3:
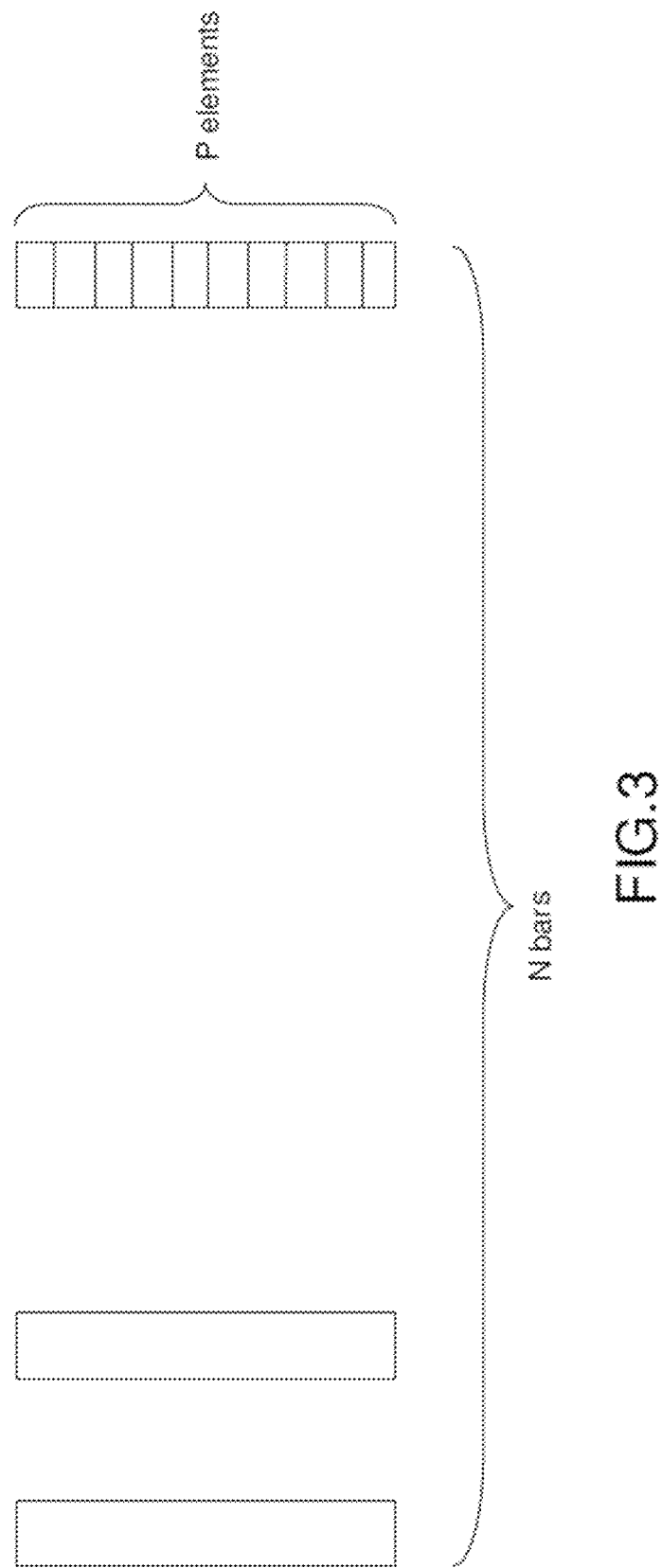
FIG. 3, an illustration of an example of ATC antenna.

Before describing the invention in more detail, the principle of the invention is reviewed in light of the representation of an ATC antenna of a secondary radar illustrated by FIG. 3. In this example, the antenna is of the LVA type. It comprises N bars, each bar comprising P dipoles, for example 35 bars each with 11 elements. The invention exploits the content of the DF17 messages which specifies the position (LAT-LONG) of the transponder and the detection and measurement of the position thereof by the radar. The distribution of the energy received between the N bars makes it possible to measure the position in azimuth and the distribution of the energy received between the dipoles of each bar defines the elevation pattern.

In order to isolate a localized degradation either at the level of the distributor between the bars, or at the level of a bar, or of a dipole of a bar, the invention accumulates the measurements by elevation segment. It is the asynchronism of the long ADS-B squitter (DF17) and the disparity of the targets in altitude and distance (therefore in elevation) which makes it possible to cover practically all of the antenna lobe over a given period (for example one day).

Thus, as will be described hereinbelow, the invention consists notably in measuring the misalignment with respect to the axis of the antenna by elevation segment of the ADS-B squitters received by the radar in its main beam, measuring the error of the angle error measurement curve used by the radar for its angle error measurement function based on difference between the position given by the ADS-B squitter and that measured simultaneously by angle error measurement by the radar on the same ADS-B squitter, then in integrating, over a long period (daily for example), these errors by elevation segment.

Similarly, the measurements of the power in each pattern associated with the ADS-B squitter make it possible to calculate the relative power of SUM, DIFF and CONT_Front versus SUM max for the misalignment of the ADS-B squitter in the lobe, then to integrate, over a long period (daily), these measurements by elevation segment.

In this way, without interference with the operational operation of the radar and without beacon, only using aircraft equipped with feasibility ADS-B, it is possible to automatically detect a current deterioration notably of the azimuth accuracy of the radar independently by elevation segment or more globally of the main beam of the radar.

The principle consists in using the Fruits (asynchronous replies) that are the long ADS-B squitters received by the radar in its main beam corresponding to the cases of an aeroplane present in the main lobe of the radar at the moment when it transmits a squitter. Indeed, through its primary mission of locating a target, the long ADS-B squitter DF17 relates intrinsically to the Latitude-Longitude position (LAT-LONG) of the target.

Upon its reception, like any other Fruit, the ADS-B squitter is enriched with the powers received on the different patterns of the radar antenna as well as the measured angle error measurement value as for any response received in the lobe of the radar (this angle error measurement value having meaning only in the main beam, more specifically in the vicinity of the axis of the antenna, i.e. in the regions of 2.5° to +2.5° for an ATC antenna of 2.4° 3 dB lobe).

The invention exploits only the ADS-B squitters validated by the radar, that is to say using selective interrogations positively replied to by the same target to the radar in its operational task of surveillance of its air coverage of responsibility thereby avoiding taking into account ADS-B squitters from a spoofer whose declared position may be false or from a target whose flight has shown various errors with the prior detections of the radar.

The invention therefore advantageously exploits the long ADS-B squitters whose position in relative bearing relative to the axis of the antenna situates them in the main beam (parameter dependent on the type of antenna, ATC or IFF). For each long ADS-B squitter, the invention therefore calculates:
- its relative bearing with accuracy by exploiting the LAT-LONG position of the squitter and the LAT-LONG position of the radar, thus giving its misalignment in the beam of the antenna of the radar;
- its relative power measured from the SUM, DIFF and CONT_Front patterns versus SUM_max of the quasi-simultaneous synchronous plot of the squitter by the same reception chain of the radar (necessary for the detection function of the radar);
- its angle error measurement voltage measured by the same reception chain of the radar (necessary for the azimuth location function of the radar);
- the error with the theoretical curves of the antenna:
  - according to the elevation of the target relative to the position of the radar;
  - according to the azimuth of the squitter;
    - in relative amplitude for the SUM, DIFF and CONT versus SUM_max patterns;
    - in angle error measurement with reference to the angle error measurement table giving, on the same reply without interference with the operational operation of the radar, the measured misalignment of the target as a function of the angle error measurement voltage of the reply.

It should be noted that, to extend the range of measurements and thus improve the accuracy of this monitoring of the patterns of the main beam, the invention performs a calculation for each elevation segment in order to take account of the effects of flaring of the patterns of the antenna (therefore notably of the angle error measurement function) in terms of cosine of the elevation of the target relative to the radar.

To guarantee a good accuracy of the individual measurements, the following are for example exploited:
- the squitters of strong level (short range) in order to limit the effect of the noise of the receiver while ensuring a sufficient dynamic range for the measurement of the SUM, DIFF and CONT_Front beams;
- the squitters from a target at short and medium range (according to the elevation) to optimize the measurement of angle error measurement error by minimizing the influence of the accuracy of position of the target transmitted by the latter upon the detection of the ADS-B squitter (variable latency between the measured GPS position of the squitter and the time of reception of the squitter by the radar).

The accumulation of these measurements for a significant time makes it possible to cover all the values of elevations, of azimuths and of relative bearings that the radar exploits and thus improve the accuracy of the calculations of errors according to the 3 axes retained. Furthermore, the accumulation of these errors (angle error measurement and amplitude as a function of relative bearing) by azimuth segment (with a one-degree pitch for example) makes it possible to reveal singularities linked to a given azimuth.

These errors are analysed (by automatic means for example). If the analysis result estimates an excessive number of errors (in amplitude as in angle error measurement), assumptions on the source of the degradation can be made:
- if it does not depend on the azimuth of the squitter or on the relative bearing or on the elevation:
  - it can relate to a deterioration of the downlead cables;
- if it depends on the azimuth of the squitter but not on the relative bearing or on the elevation:
  - it can relate to a deterioration of the rotating joint joining the fixed part and the rotating part of the antenna of the radar;
- if it depends on the relative bearing but not on the azimuth of the squitter or on the elevation;
  - it can relate to a deterioration of a vertical dipole of the antenna or of the distributor of the antenna;
- if it depends on the relative bearing and on the elevation but not on the azimuth of the squitter:
  - it can relate to a deterioration of a radiating element of a vertical dipole of the antenna.

Other assumptions on sources of degradation can be made.

Thus, an ongoing analysis of these measurements allows for an automatic alert in order to provide, if necessary, a repair operation that can be scheduled before the performance levels of the radar are degraded in an approach of HUMS ("Health and Usage Monitoring Systems") type.

With regard to the decoding of the "long ADS-B squitter" replies, chapter 3 of Annexe 10—Aeronautical telecommunications—gives the summary of the Mode S reply (downlink) formats.

The long ADS-B squitters (DF17 and DF18) are indeed of a message format identical to the synchronous replies that a radar processes. Thus, the use of a similar processing on the asynchronous replies as on the synchronous replies makes it possible to obtain identical pattern measurements according to the two kinds of messages and thus be able to deduce therefrom common conclusions, namely that a degradation of the antenna measured by the asynchronous replies is completely applicable to the synchronous replies.

The detection of the replies by a radar according to the invention differs according to whether these replies are synchronous or asynchronous as summarized in Table 1 below according to the patterns of the antenna, the numeric data being given by way of example:

|  | LSB unit | Synchronous response Main lobe | Asynchronous response Main lobe | Asynchronous response Excluding main lobe |
| --- | --- | --- | --- | --- |
| Detection time | ms | Yes | Yes | Yes |
| Mode S address |  | Yes | Yes | Yes |
| Antenna azimuth | ACP14 | Yes | Yes | Yes |
| Off Boresight Angle_OBA | ACP14 | Yes | Yes | No |
| Target azimuth | ACP14 | Yes | Yes | No |
| Target distance | 50 ns | Yes | No | No |
| Target elevation |  | Yes | No | No |
| Secondary protocol |  | IFF/SSR | ModeS | ModeS |
| DF format |  | Yes | Yes | Yes |
| Data Mode S |  | Yes | Yes | Yes |
| SUM power | 0.1 dBm | Yes | Yes | Yes |
| DIFF power | 0.1 dBm | Yes | Yes | Yes |
| CONT_Front power | 0.1 dBm | Yes | Yes | Yes/No |
| CONT_Back power | 0.1 dBm | No | No | Yes/No |

According to the invention, all the asynchronous replies are enriched with the measured power according to each pattern.

The different Mode S responses, synchronous and asynchronous, are very similar with regard to the Mode S address:
either in the parity field;
or in the data field.

The Mode S address is a unique identifier of the transponder and therefore makes it possible, in asynchronous processing as conventionally in synchronous processing, to identify a target and ensure, through a selective interrogation of the radar, that the ADS-B squitter is indeed a real target in the coverage of the radar.

The invention does not take account of the ADS-B squitters considered doubtful, that is to say not validated by the selective interrogations of the radar.

Figure 4:
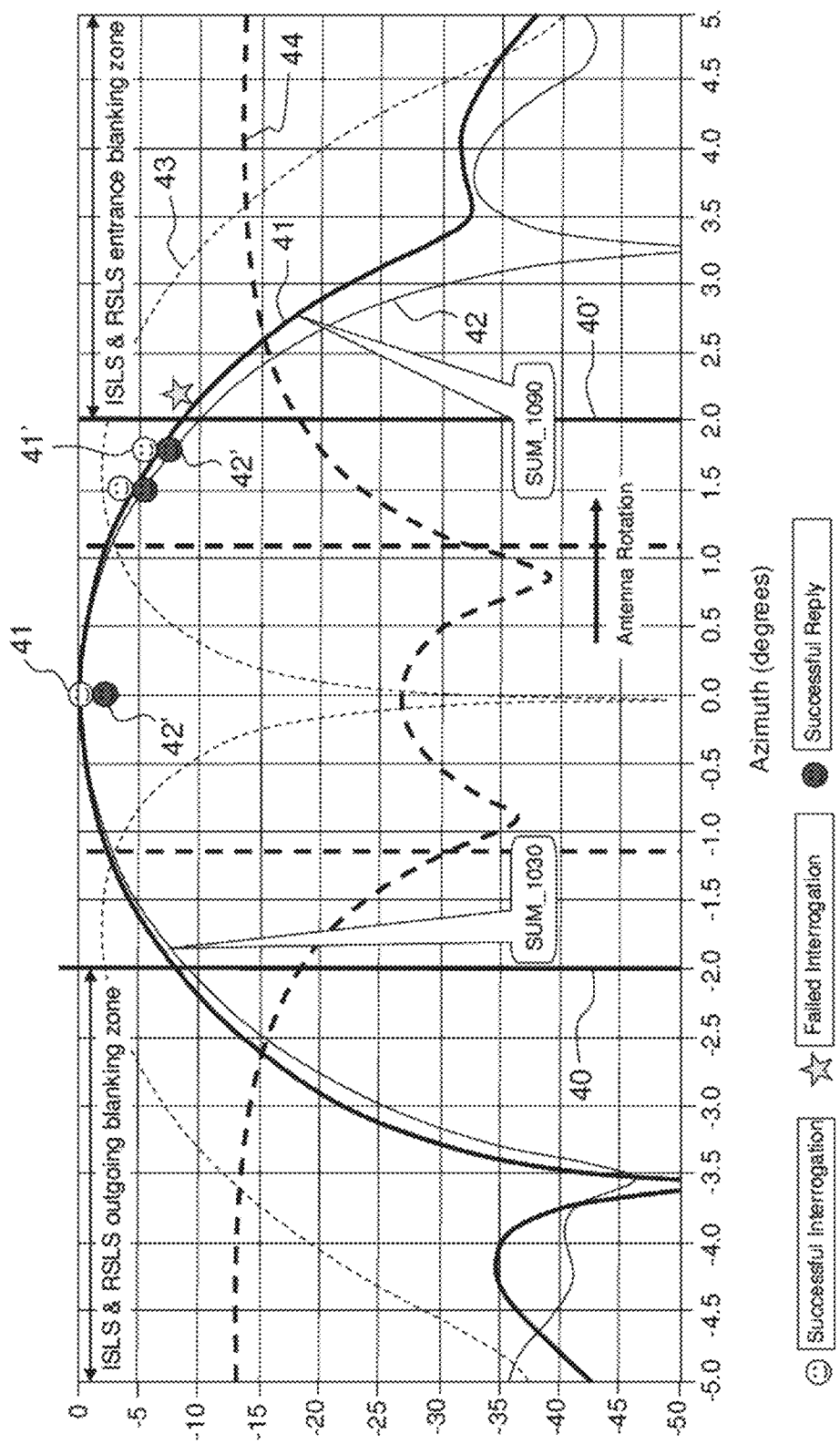
FIG. 4, an illustration, by an example, of the typical synchronous operation of a secondary radar.

FIG. 4 illustrates, by an example, the typical synchronous operation of a secondary radar exploiting the main beam both in transmission and in reception, of a conventional ATC antenna with three patterns (SUM, DIFF, CONT_Front), within an azimuth area bracketed by two limits 40 (to ≈−2°), 40' (to ≈+2°):
SUM for:
the generation of the interrogations to the transponder (curve 41) with the interrogations 41';
the detection of the replies of the transponder (curve 42) with the replies 42',
DIFF for:
the location of the replies with respect to the axis of the antenna (curve 43);
for certain types of radar, the discrimination of entangled replies;
CONT_Front for delimiting the replies to be processed in the beam of the antenna (curve 44):
ISLS: block in transmission (1030 MHz) the transponders outside of the core of the main beam (see the star in FIG. 4 corresponding to an interrogation rejected by the transponder);
RSLS: reject on reception (1090 MHz) the replies outside of the core of the main beam.

Figure 5:
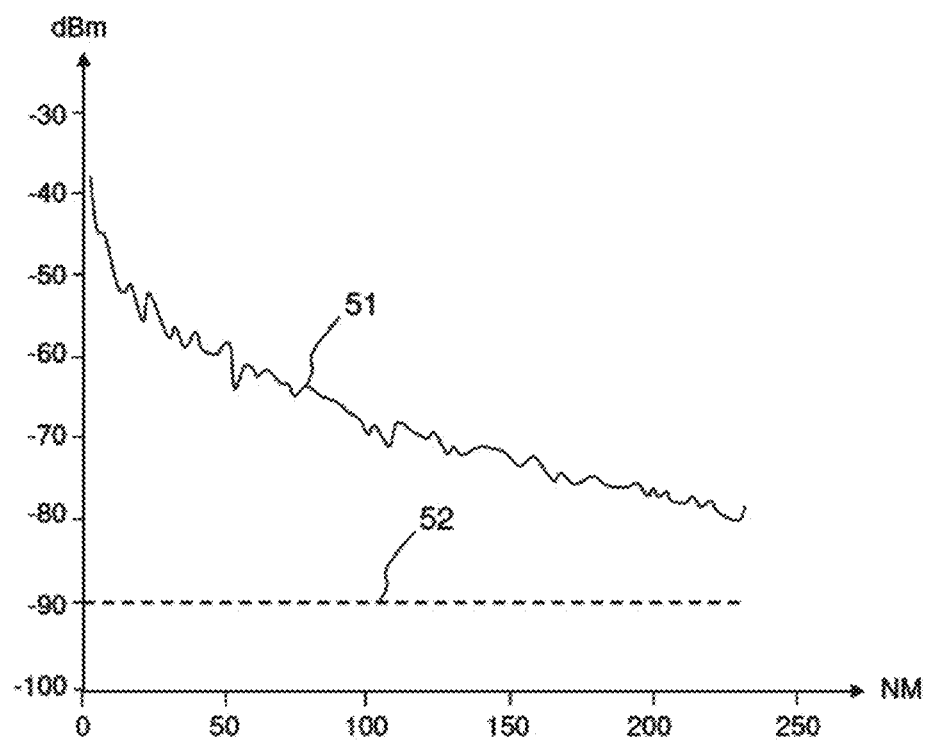
FIG. 5, an illustration of the received power as a function of the distance from the target.

FIG. 5 illustrates the received power as a function of the distance of the target. The curves of FIG. 4 representative of the patterns of the antenna show that the power dynamic range of the signals to be processed, in the main beam, is of the order of 25 dB to 35 dB relative between the patterns. The curve 51 indicates the average power per target received (that is to say per plot) as a function of the distance of the target. This curve 51, typical of the downlink radar budget, makes it possible to evaluate the power of the signal received from a target. To guarantee a good dynamic range and accuracy, the method according to the invention uses only the near targets whose power level is at least 35 dB above the threshold 52 of detection and of decoding of the ADS-B replies by the radar. Given that the long ADS-B squitters taken into consideration for the invention are those received in the main beam of the radar, their level is close to that of the same target when it replies in synchronous mode to the radar. In practice, that leads for example to using, for the measurement of the patterns, only the long ADS-B squitters for which the target is within 50 Nm of the radar, this value being able to be adjusted by parameter by an operator.

Figure 6:
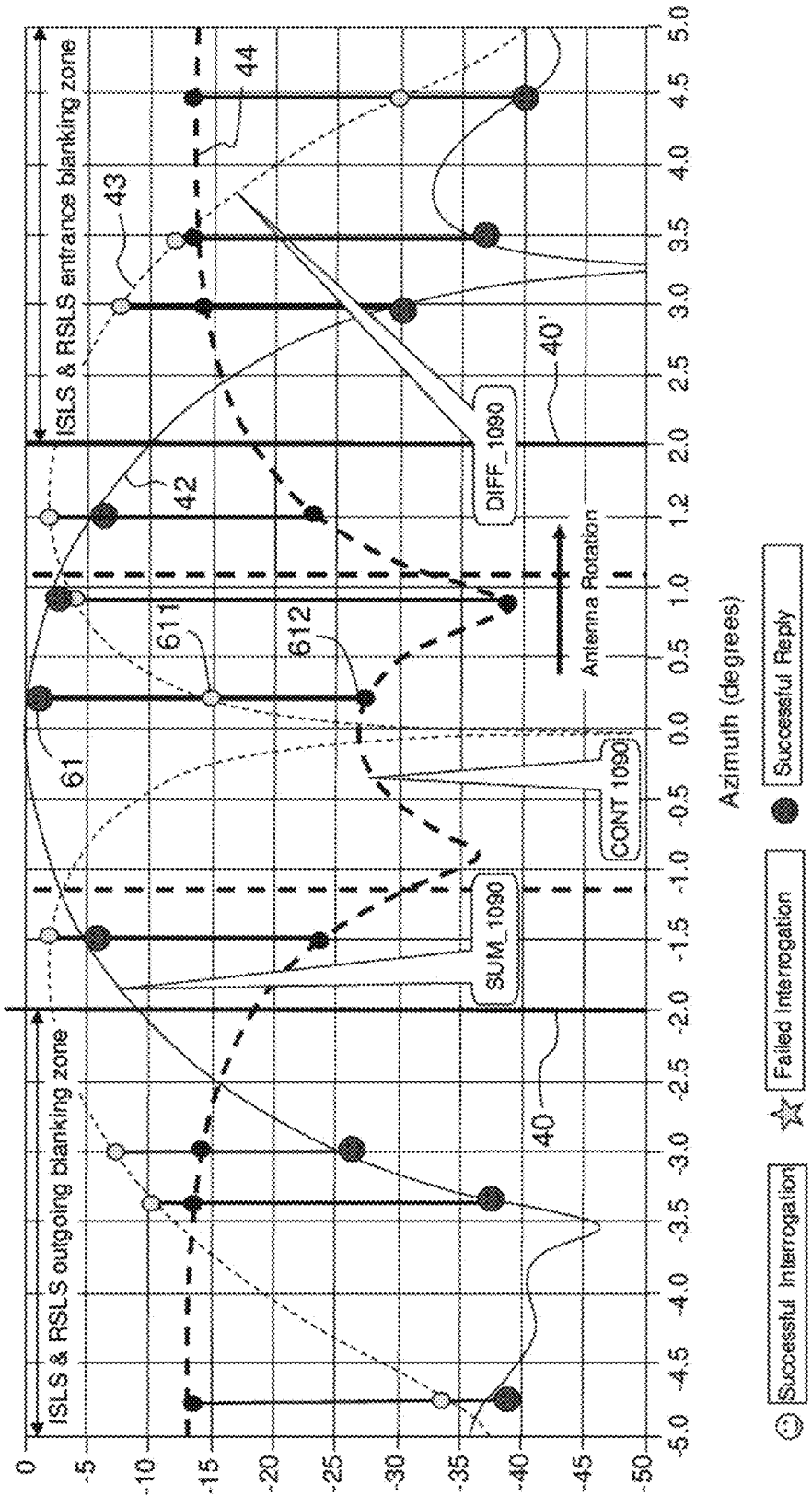
FIG. 6, an illustration of the principle of the invention by an example of sampling of the patterns of an antenna by asynchronous squitters transmitted by different targets.

FIG. 6 illustrates the principle of the invention through an example of sampling of the patterns of the antenna in reception at 1090 MHz by ten or so squitters transmitted by different targets. The patterns are the same as those of FIG. 4 described in the case of a synchronous use, only the interrogation pattern 41 having been eliminated. The invention advantageously exploits the long ADS-B squitters to permanently measure, with great accuracy, the patterns of the main beam of the antennas of the secondary radar, with targets of opportunity according to different elevations chosen at distance depending on the type of measurement performed.

When the main beam of the radar illuminates targets, the latter are interrogated selectively by the radar as shown in FIG. 4, and can automatically transmit squitters at their own rate including the long ADS-B squitters as illustrated in FIG. 6.

This figure shows a typical ATC or IFF antenna of 3 patterns: SUM, DIFF and CONT_Front, represented respectively by the curves 42, 43, 44.

At a given instant, the different targets, present in an azimuth of −5° to +5° from the axis of the antenna, can transmit long squitters 61. Each squitter detected in the lobe is enriched with:
its received levels on the 3 patterns 42, 43, 44—thus a squitter is received at level 61 on the SUM pattern 42, at a level 611 on the DIFF pattern 43 and at a level 612 on the CONT_Front pattern 44;
its angle error measurement voltage calculated by the radar from the reply signals received on DIFF and SUM;
its relative bearing versus the axis of the antenna (abscissa X axis).

According to the distance from the target, the dynamic range of the signal (ordinate Y axis), given by the received level versus the measurement threshold of the radar, makes it possible to have the required dynamic range (around 35 dB).

Each squitter being characterized by the Mode S address of the target:
some squitters give the LAT-LONG position of the target;
others give the altitude of the target (barometric or GNSS).

The asynchronism between:
the position of the targets in azimuth and elevation;
the rotation of the beam of the radar;
the spontaneous transmission of the long ADS-B squitters by the targets; makes it possible, throughout the rotation of the antenna of the radar over a long period, to sample all the possible positions:
in relative bearing;
in elevation (deduced from the LAT-LONG position giving the distance and the altitude of the target);
in azimuth of the axis of the antenna beam.

The accumulation of the measurements from the ADS-B squitters is also performed. To this end, the invention tracks all the long ADS-B squitters (asynchronous) in order to construct ADS-B tracks, in a way similar to the synchronous tracks of the radar. These tracks are characterized mainly by:
the Mode S address;
the current position of the target and its speed vector in 3D (azimuth, distance, altitude);
the current power of the target;
the possible use of this track by the method according to the invention.

Even if a squitter from a target is not received in the main beam of the antenna, it is tracked in order to enrich the track of the data cited above.

Indeed, according to the value of the TC, a long ADS-B squitter DF17 comprises a datum, notably the LAT-LONG position and the altitude.

For each usable squitter (one validated by the radar) received in the main beam (misaligned for example by at most −10° to 10° in relative bearing from the axis of the antenna upon its detection, bearing in mind that this angular range is not limiting, the invention being able to be applied over −180° to 180°), the method according to the invention:
exploits the information contained in the squitter;
completes the missing information from the data of its track;
calculates the relative power then the error of the gain of the patterns of the antenna as a function of the relative bearing:
in the same beam, the radar measures the power of the synchronous plot (see FIG. 4): this is the SUM_max value (in dBm) that can be obtained by this radar configuration at this distance from the target;
the reply of the long ADS-B squitter is enriched with a power measurement (in dBm) on the SUM, DIFF and CONT patterns, the method according to the invention deducing, for the relative bearing of the squitter:
SUM-relative (dB)=SUM (in dBm)−SUM_max (in dBm);
DIFF-relative (dB)=DIFF (in dBm)−SUM_max (in dBm);
CONT-relative (dB)=CONT (in dBm)−SUM_max (in dBm);

SUM-relative (dB), SUM (in dBm) and SUM_max (in dBm) are defined as follows: the curves in FIG. 4 (or in FIG. 6) represent the relative gains (in dB), relative to the maximum power SUM_max in the axis of the antenna, of the SUM, DIFF, CONT antenna patterns, according to the misalignment in relative bearing of the axis of the antenna. When an ADS-B reply is received with a certain misalignment, the measurement of power (in dBm) is performed according to the three patterns. DIFF-relative (dB) and DIFF (in dBm), CONT-relative (dB) and CONT (in dBm) are defined similarly for the DIFF and CONT patterns.

By comparing the power of the synchronous plot temporally closest to the ADS-B fruit, here called SUM_max, in dBm, to that of the ADS-B on the three patterns, the points of the curve 42" (SUM), of the curve 43" (DIFF) and of the curve 44" (CONT) of the relative gain are obtained according to the misalignment as presented in FIG. 7 which will be described hereinbelow.

The gain error of each pattern is established by comparing these values to those of reference of the invention (patterns measured either on receipt of the radar in the factory, or on acceptance of the radar site):
SUM_err (dB)=SUM-relative (dB)−SUM-reference (dB);
DIFF_err (dB)=DIFF-relative (dB)−DIFF-reference (dB);
CONT_err (dB)=CONT-relative (dB)−CONT-reference (dB);
for the main lobe, the angle error measurement error is established by comparing the position measured by the radar to that transmitted in the ADS-B squitter for the misalignment thereof in the beam by taking account of the deformation of the beam in elevation relative to the antenna.

During the time of the analysis, these different values are accumulated as a function of the relative bearing according to:
the azimuth of the antenna (to the pitch of the degree for example);
but also whatever the azimuth;
the elevation of the target.

The use of a positionwise free standing ADS-B squitter detected in the main lobe presents 2 major advantages:
for the measurement of the patterns in the main beam (from −10° to +10° from the axis), following the quasi simultaneous reception of the ADS-B squitter and of the synchronous plot, the power transmitted by the target is then constant both for the synchronous replies of the plot and the asynchronous reply of the squitter making it possible to have a very accurate relative measurement of the 3 SUM, DIFF, CONT patterns;
for the "monitoring" of the azimuth accuracy of the radar, the measurement according to the radar method of the azimuth position of the target having transmitted the ADS-B squitter directly from the ADS-B reply makes it possible to have a very accurate measurement of angle error measurement error since the target has not moved between the position transmitted and that measured.

Figure 7:
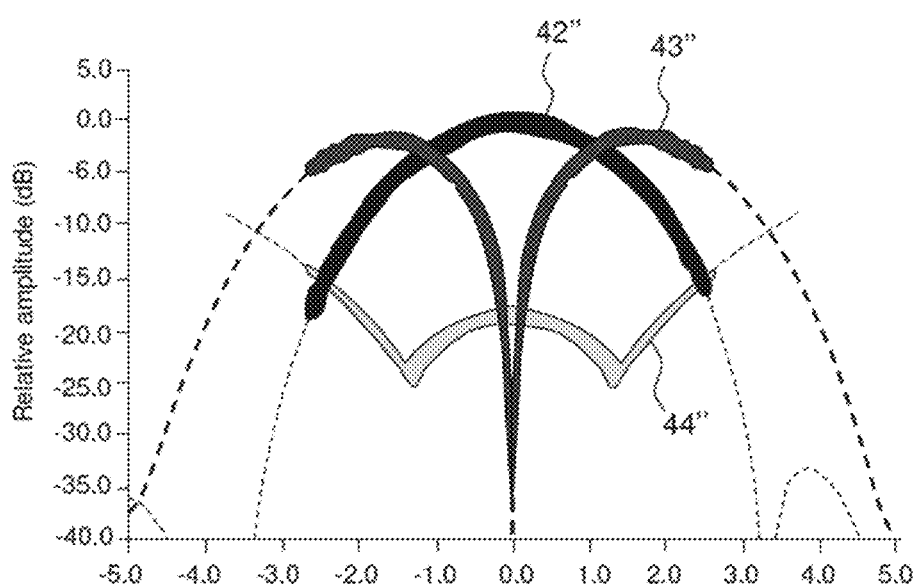
FIG. 7, examples of patterns measured by the method according to the invention.

FIG. 7 illustrates the accumulation of these values which makes it possible to reconstruct the SUM pattern (measured pattern 42"), the DIFF pattern (measured pattern 43") and the CONT pattern (measured pattern 44"), between −5° and +5°. In this example, the emboldened parts of the SUM, DIFF, CONT patterns are obtained with approximately 18 000 replies.

The factory acceptance plots are done conventionally with a relative bearing pitch equal to approximately 0.05°.

In order to have an accuracy of that order, the analysis time has to be sufficiently great (of the order of a day for example) in order to have enough samples in each cell (azimuth, elevation, relative bearing). Indeed, it is the targets as a function of their relative position to the radar in the site considered which sample the patterns of the antenna, so only the duration of the analysis makes it possible to collect enough measurements.

It should be noted that the figures given here are given only as an indication of an order of magnitude, in effect they can be parameterized by an operator as a function in particular of his or her needs in terms of accuracy, in terms of refresh rate and according to the rate of fruits available from aeroplanes close to the radar.

Figure 8:
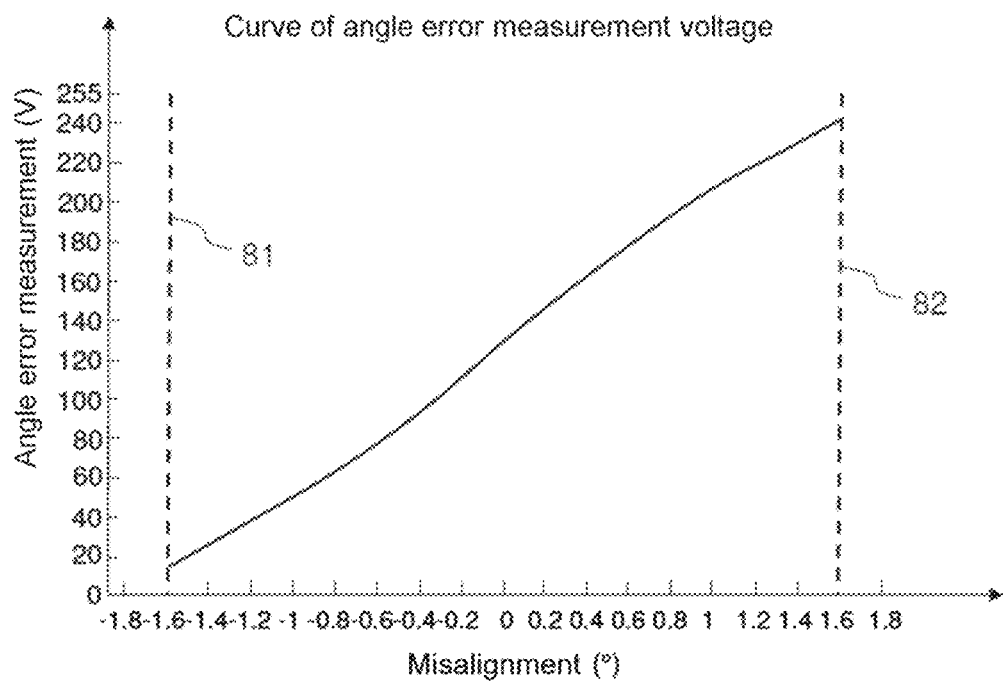
FIG. 8, a curve of angle error measurement voltage as a function of the misalignment of the target in the main lobe.

FIG. 8 presents a zoom on the useful part of the curve of the angle error measurement voltage as a function of the misalignment in the main lobe. This curve is stored inverted in the angle error measurement table which is used by the radar, as a function of the measurement of the DIFF/SUM ratio of a synchronous or asynchronous reply received in the main lobe, to evaluate the misalignment thereof with respect to the axis of the antenna.

The vertical dotted lines 81, 82 delimit the useful zone of the curve conventionally exploited by a radar associated with an LVA antenna of 2.4° at −3 dB.

Figure 9:
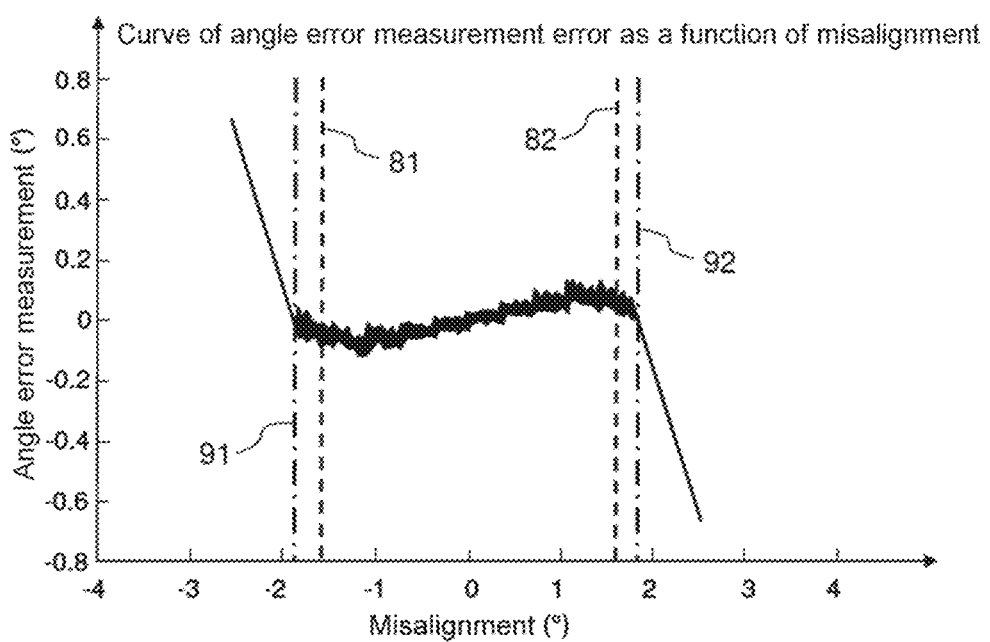
FIG. 9, a curve of azimuth accuracy error of the radar as a function of the misalignment of the target in the main lobe.

FIG. 9 presents the plot of the curve of error in azimuth over a large number of replies (more than 8000) as a function of the misalignment of the target in the main lobe. It will be noted that the latter begins to show a slight slope with errors of close to +/−0.1° at lobe edge compared to the azimuth accuracy expected of a radar in terms of standard deviation of 0.08°. As defined by way of example in this radar, the angle error measurement table is limited to the range lying between the dotted lines 91, 92, coherently it is normal for the error to cross far outside of this area not exploited by the radar by way of example.

The invention establishes a template of the different SUM, DIFF, CONT and angle error measurement error antenna patterns as a function of the factory plots of the antenna (in factory acceptance) with which the radar site is equipped.

Following the calculation of the antenna and angle error measurement error patterns, typically each day, the method according to the invention compares the measurements performed to the template and produces a summary of the points outside of the template, weighting the latter by considering the quantity and the quality of the fruits used to measure the patterns and the angle error measurement.

This HUMS summary, typically daily, makes it possible to evaluate a potential current degradation of the antenna (including cable and rotating joint).

Furthermore, by having established the characteristic deformation of the antenna patterns and the deformation of the angle error measurement curve as a function of different types of degradation specifically of the aerial, the invention proposes degradation elements:

loss of uniform level of the SUM, DIFF and/or CONT patterns whatever the azimuth, the relative bearing and the elevation;
increasing losses of the RF cables by xdB;
loss of azimuth accuracy whatever the azimuth, the relative bearing and the elevation;
increasing losses of the RF cable, of SUM or of DIFF by xdB;
loss of azimuth accuracy at certain azimuths whatever the relative bearing and elevation;
degradation of the rotating joint in amplitude of XX or in phase of YY at one or more given azimuths;
deformation of the patterns at certain relative bearings whatever the azimuth and the elevation;
degradation of a radiation column or at the level of the distributor of the antenna.

Other signs of degradation can also be obtained.

This ongoing analysis of the three antenna patterns and of the angle error measurement is performed with respect to several templates. It makes it possible to functionally quantify a degradation of the performance levels that can ultimately declare the radar or the ADS-B receiver using the same aerial as degraded or failed.

Beyond the usual templates for guaranteeing the performance, dedicated templates can be provided in order to detect normal degradations of the aerial with which the deformations of the antenna patterns following these degradations will have been associated, Finally, the day-by-day tracking of the trend of the degradations makes it possible to schedule a limit date of intervention on the radar site before the latter influence the performance levels of the radar in such a way as to render the latter non-operational.

Furthermore, an additional advantage of the invention is the following: the establishment of the error of the angle error measurement function, daily for example, makes it possible, when the latter remains within a tolerance template that is still acceptable to an operator, to correct the angle error measurement table that the radar uses to locate the synchronous targets in azimuth in the beam and thus still ensure a good azimuth accuracy of the radar when a degradation of the aerial or ageing of the aerial begins. The aerial being the assembly composed at least of the antenna 1, of the downlead cables and of the rotating joint.

Figure 10:
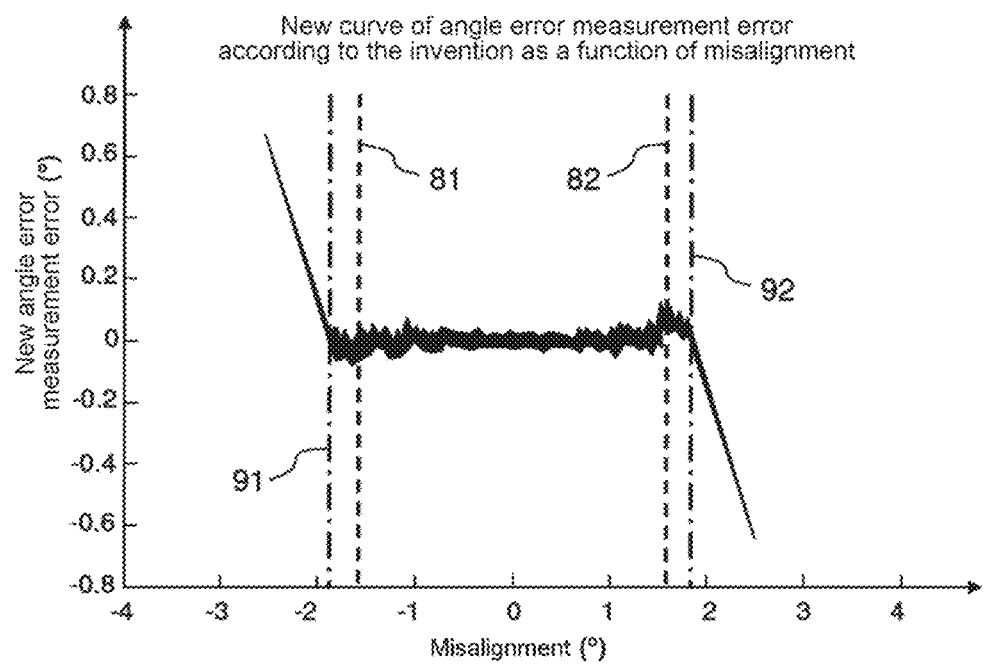
FIG. 10, a new curve of azimuth accuracy error of the radar as a function of the misalignment following the calculation of a new angle error measurement table according to the invention.

FIG. 10 presents the plot of the new azimuth error curve according to the invention after calculation of the new angle error measurement table over the same large number of replies (more than 8000) as a function of the misalignment of the target in the main lobe. Note that the latter is almost flat, exhibiting errors that are all clearly less than +/−0.05° peak-to-peak.

Figure 11:
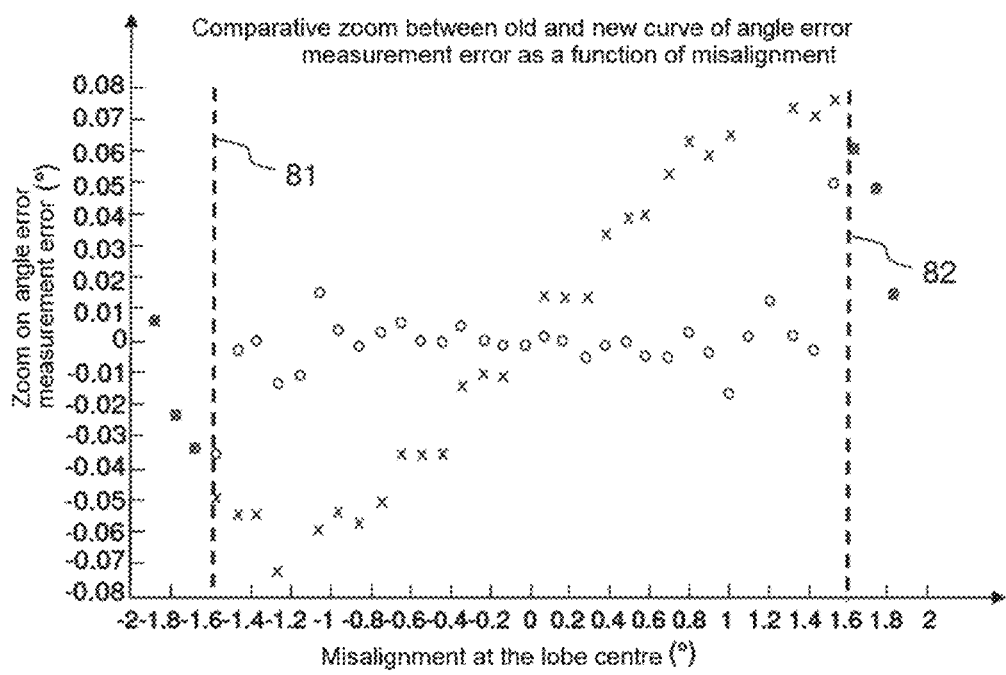
FIG. 11, a zoom on the useful part of the main lobe comparing the azimuth accuracy error of the radar as a function of the misalignment between the old and new angle error measurement tables according to the invention.

FIG. 11 presents a zoom on the useful part of the lobe by comparing the plots of the azimuth error curves as a function of the misalignment of the target, by employing either the old angle error measurement table or the new one according to the invention over the same large number of replies (more than 8000).

Immediately of note therein is the gain in azimuth accuracy of the radar according to the misalignment of the synchronous reply: with the new angle error measurement curve, the azimuth error is very low and almost constant whatever the position of the target in the lobe.

The invention claimed is:

1. A method for measuring antenna patterns and angle error measurement by elevation segments of a secondary radar, each pattern being associated with a reception channel, wherein over a given time period,
the unsolicited asynchronous replies, of DF 17/18 ADS-B squitters type, transmitted by targets present in the airborne environment of said radar, are detected, each of said squitters containing 3D position information on the target which transmits it;
for each detection, the DF 17/18 ADS-B squitter is decoded to check that the detected target is located in accordance with the position information contained in said squitter, the non-conforming detections being rejected;
for each detection retained, the time of said detection, the value of the azimuth of the axis of the main beam of said antenna, the angle error measurement voltage and the received power value on each of said SUM, DIFF, CONT_Front, CONT_Back reception channels are associated with said detection, the position information contained in said squitter giving, by calculation, the elevation segment in which said detection is situated;
said values obtained over said period being stored, the measured patterns and the angle error measurements being sampled, by elevation segment, from said stored values.

2. The method according to claim 1, wherein said antenna comprises one of the following sets of patterns:
a sum pattern (SUM), a difference pattern (DIFF), a control pattern for rejecting replies from targets facing the antenna (CONT_Front) and a control pattern for rejecting targets behind the antenna (CONT_Back);
a sum pattern (SUM), a difference pattern (DIFF), a control pattern (CONT);
a sum pattern (SUM) and a difference and control pattern (DIFF/CONT).

3. The method according to claim 1, wherein the replies of DF 17/18 ADS-B squitters type are enriched by characteristics representative of the acquisition of said replies, said characteristics being, for each reply, at least one of the following characteristics:
the received power according to each pattern of said antenna;
the angle error measurement of the reply in the main lobe of said antenna;
the time of the detection of said reply;
the azimuth of the axis of the main beam of said antenna upon said detection.

4. The method according to claim 3, wherein for each squitter received in the main beam, said method:
exploits the information contained in the squitter;
calculates the relative power then the error of the gain of the patterns of the antenna as a function of the relative bearing:
in the same beam, said radar measuring the power of the synchronous plot, said power being the maximum value of the sum pattern;

the DF 17/18 ADS-B squitter reply being enriched with a measurement of power on the sum, difference and control patterns, the method according to the invention deducing, for the relative bearing of the squitter:

SUM-relative (dB)=SUM (in dBm)−SUM_max (in dBm);

DIFF-relative (dB)=DIFF (in dBm)−SUM_max (in dBm);

CONT-relative (dB) =CONT (in dBm)−SUM_max (in dBm);

the gain error of each pattern is established by comparing these values to those of reference of the invention, which are derived from patterns measured either on receipt of the radar in the factory, or on acceptance of the radar site:

SUM_err (dB)=SUM-relative (dB)−SUM-reference (dB);

DIFF_err (dB)=DIFF-relative (dB)−DIFF-reference (dB);

CONT_err (dB)=CONT-relative (dB)−CONT-reference (dB);

calculates the angle error measurement error by taking account of the deformation of the beam in elevation relative to the antenna.

5. The method according to claim 1, wherein for the duration of the analysis, said values are accumulated as a function of the relative bearing over time according to:
the azimuth of said antenna;
the elevation of said target.

6. The method according to claim 1, wherein over said given period, the angle error measurement error and the error of each pattern are accumulated in tables with three inputs, one table being associated with the angle error measurement error and with the error of each antenna pattern, one input being the relative bearing as a function of the axis of the main lobe of the antenna, the second input being the elevation of the target as a function of the horizontal alignment of the antenna and the third input being the antenna azimuth.

7. The method according to claim 6, wherein for each cell of said table, each cell being defined by a relative bearing and an elevation, the angle error measurement error and the error of each pattern are established by methods of average or histogram.

8. The method according to claim 1, wherein under the control of an operator or automatically, said radar employing an angle error measurement table to locate the synchronous targets in azimuth in said main beam, said table is corrected on the basis of the measured angle error measurement errors in order to ensure a good azimuth accuracy of said radar in the event of a degradation or ageing of an assembly composed at least of said antenna, of downlead cables and of a rotating joint.

9. The method according to claim 1, wherein the antenna, with which an Air Traffic Control secondary radar or an Identification Friend of Foe secondary radar type is equipped, comprises at least two patterns.

10. Method according to claim 1, wherein said antenna has fixed or rotating electronic scanning.

11. The method according to claim 1, wherein the measurements of the angle error measurement error and of the antenna patterns are used to evaluate the level of degradation or ageing of an assembly composed at least of said antenna, of the downlead cables and of the rotating joint.

12. The method according to claim 1, wherein the measurement of said patterns is used to evaluate the level of degradation or ageing of an assembly composed at least of said antenna, of the downlead cables and of the rotating joint.

13. A secondary radar, comprising:
means for detecting over a given time period, the unsolicited asynchronous replies, of DF 17/18 ADS-B squitters type, transmitted by targets present in the airborne environment of said radar, each of said squitters containing 3D position information on the target which transmits it;
means for decoding for each detection and over said time period, the DF 17/18 ADS-B squitter, to check that the detected target is located in accordance with the position information contained in said squitter, the non-conforming detections being rejected;
means for associating with said detection and over said time period, for each detection retained, the time of said detection, the value of the azimuth of the axis of the main beam of said antenna, the angle error measurement voltage and the received power value on each of said SUM, DIFF, CONT_Front, CONT_Back reception channels, the position information contained in said squitter giving, by calculation, the elevation segment in which said detection is situated;
means for storing over said time period, said values obtained over said period,
means for sampling, over said time period, the measured patterns and the angle error measurements, by elevation segment, from said stored values.

\* \* \* \* \*